United States Patent [19]

Hartwig

[11] Patent Number: 5,001,360

[45] Date of Patent: Mar. 19, 1991

[54] METHOD AND DEVICE FOR CONVERTING VOLTAGE TO FREQUENCY

[75] Inventor: Hagen Hartwig, Erlangen, Fed. Rep. of Germany

[73] Assignee: Siemens Aktiengesellschaft, Munich and Berlin, Fed. Rep. of Germany

[21] Appl. No.: 495,689

[22] Filed: Mar. 16, 1990

[30] Foreign Application Priority Data

Mar. 17, 1989 [DE] Fed. Rep. of Germany ....... 3908849

[51] Int. Cl.$^5$ .......................... H03L 7/00; H03M 1/60
[52] U.S. Cl. .................................. 307/271; 331/1 R; 341/157
[58] Field of Search ................. 307/271; 331/1 R, 34, 331/17; 328/15, 140, 14; 341/110, 157

[56] References Cited

U.S. PATENT DOCUMENTS

| 3,094,629 | 6/1963 | Ostroff et al. ...................... 307/88.5 |
| 3,260,943 | 7/1966 | Heulsman et al. ..................... 328/69 |
| 3,327,229 | 6/1967 | Huelsman ............................. 328/150 |
| 3,952,253 | 4/1976 | Devolpi et al. ....................... 328/140 |
| 3,965,430 | 6/1976 | Brandt ................................. 328/140 |
| 4,309,909 | 1/1982 | Grebe, Jr. et al. ..................... 73/861 |
| 4,651,104 | 3/1987 | Miyo ................................... 307/271 |
| 4,724,419 | 2/1988 | Kreuzer ............................... 341/157 |
| 4,839,603 | 6/1989 | Mower et al. .......................... 328/14 |
| 4,868,573 | 9/1989 | Wittmer .............................. 341/157 |
| 4,926,174 | 5/1990 | Fiori, Jr. ............................. 341/110 |
| 4,943,779 | 7/1990 | Pedersen et al. ...................... 328/14 |
| 4,943,786 | 7/1990 | Cordwell et al. ...................... 331/17 |

FOREIGN PATENT DOCUMENTS

3037174 4/1981 Fed. Rep. of Germany.

*Primary Examiner*—Stanley D. Miller
*Assistant Examiner*—Toan Tran
*Attorney, Agent, or Firm*—Kenyon & Kenyon

[57] ABSTRACT

A method and device for converting voltage to frequency performs an extremely rapid and highly accurate digitization of an analog input signal at a large frequency deviation. An input voltage, which is increased into the positive range, is integrated and compared with a reference voltage which is variable in constant steps. When the integrated voltage is greater than the reference voltage, a binary signal logic "1" is generated. If the integrated voltage is less than the reference voltage, a binary signal logic "0" is formed. When the integrated voltage is less than the reference voltage, a pulse repetition frequency is formed which is proportional to the input voltage. At each pulse, the reference voltage is incremented so that this reference voltage follows the integrated voltage in a step-like manner.

10 Claims, 3 Drawing Sheets

METHOD AND DEVICE FOR CONVERTING VOLTAGE TO FREQUENCY

FIELD OF THE INVENTION

This invention relates to a method and a device for converting voltage to frequency.

BACKGROUND OF THE INVENTION

In data acquisition, a voltage/frequency converter can replace an analog/digital or digital/analog converter in many cases. A voltage/frequency converter emits as its output a frequency which is proportional to the input voltage instead of a binary parallel code word. One advantage is that the analog part of a circuit can be easily isolated from the digital part. Therefore, voltage/frequency converters are used in many diverse areas of electrical and electronic engineering. For example, when controlling electric motors, the actual current or voltage values can be easily integrated into a digital control system by converting these values into a sequence of pulses which are proportional to the actual current or voltage value.

Due to the small dimensions for which are available such a voltage/frequency converter, in many application cases, conventional voltage/frequency converters cannot always be used.

Conventional voltage/frequency converters also cannot be used when an extremely rapid and highly accurate digitization of the input signal having a large frequency deviation and the lowest possible costs is required.

For integrating the detection of the actual voltage or current value into a digital control system, it is desirable to convert a continuous signal at the location of its detection into a proportional frequency and transmit it in the form of pulses with a variable pulse repetition frequency. A high interference immunity is guaranteed, since only small demands are placed on the pulse shape for further processing of the pulses.

Thus, there is a need for a method and a device which realizes a quick and highly accurate voltage/frequency conversion having a large frequency deviation using simple means.

SUMMARY OF THE INVENTION

This and other needs are satisfied by the method and device of the present invention for converting voltage to frequency. In accordance with the present invention, an input voltage is first increased into the positive range by linking with a constant. This input voltage can have an arbitrary valve with respect to time. The raised input voltage is then integrated and compared to a reference voltage which varies in constant steps, and a binary signal is generated. This binary signal corresponds to the binary state logic "1" when the integrated voltage is greater than the reference voltage, and corresponds to the binary state logic "0" when the integrated voltage is less than the reference voltage. The reference voltage is increased by one constant voltage step with each logic "1" signal. Upon reaching a specified upper limiting value, the aforementioned process is repeated, where the integration of the raised input voltage is reversed, the reference voltage is lowered by one constant voltage step and the binary signal is inverted. Upon reaching a specified lower limiting value, the aforementioned process is again repeated where the integration of the raised input voltage is normal and the reference voltage is decreased by one voltage step each time a logic "1" is received. The pulses generated by the changeover of the respective binary state logic "0" and logic "1" are counted within one time interval.

In another development of the present invention, a sequence of auxiliary pulses is generated when the constant voltage deviation of the reference voltage does not cause the reference voltage to be greater than the integrated voltage due to the reference voltage being increased with each logic "1" signal. A sequence of auxiliary pulses is also generated when the constant voltage deviation of the reference voltage does not cause the reference voltage to be less than the integrated voltage when the input voltage is reversed, the binary signal is inverted, and the reference voltage is lowered by one voltage step at a time.

The operational reliability of the method is improved through this pulse monitoring. When the integrated voltage rises too sharply, the reference voltage at times can no longer "catch up" with the integrated voltage. In this case, the reference voltage is step-enabled faster due to the auxiliary pulses which are emitted at a high frequency by the pulse monitoring system.

In a further development of the present invention a d.c. voltage is formed from the generated pulses. A differential voltage is then formed from the d.c. voltage and the raised input voltage. A control voltage is generated from the sum of the differential voltage and the raised input voltage. This control voltage acts upon the respectively applied integrator.

This development of the present invention serves to control errors and can be applied when high demands are placed on the accuracy of the voltage/frequency conversion. This development of the present invention also serves to control errors when inexpensive and thus less accurate components are to be used for a device implementing this method.

A device for converting voltage to frequency constructed according to the present invention includes an amplifier with a positive and negative amplification which is able to change over by means of a changeover signal. The output of the amplifier is coupled to the input of an integrator. A comparator with at least two inputs is provided and the first input of the comparator is coupled to the output of the integrator and the second input of the comparator is coupled to the analog output of a digital/analog converter. The output of the comparator is coupled to the input of a digital comparator. The digital comparator can emit a binary signal logic "1" or logic "0" as a function of the difference of the input signals over a first output. The digital comparator can emit the inverted binary signal of the first output over a second output. A multiplexer is provided whose inputs are coupled to the outputs of the digital comparator and which applies the uninverted or inverted binary signal at its output as a function of the changeover signal. Evaluating logic is coupled to the output of the multiplexer and counts incoming pulses during a specific time interval. The sum of the pulses per time interval can be picked off at the output of the evaluating logic for further processing. A counter is provided having a changeable counting direction. The counting pulse input of the counter is coupled to the output of the multiplexer and the output of the counter is coupled to the digital input of a digital/analog converter. The counter outputs an overshoot signal through an overshoot output whenever a respective specifiable upper or lower counting limit is reached. A bistable switch emits a changeover signal at each overshoot signal of the counter. The changeover signal brings about the changeover between the positive and negative amplification of the amplifier. The changeover of the counting direction of the counter is caused by the changeover input as well as the changeover of the multiplexer.

In a further development of the present invention, a pulse monitoring system is provided between the multiplexer and the evaluating logic. The pulse monitoring system has the capability of emitting a sequence of auxiliary pulses as a function of the output signals of the multiplexer. The counting pulse input of the counter is coupled to the output of the pulse monitoring system.

In a further development of the present invention, a controlled system converts generated pulses into a direct voltage. The controlled system includes a monstable precision switch which is coupled to an oscillator and which generates a pulse with a constant pulse width upon receiving a pulse at its input. A switch passes incoming precision pulses having a constant amplitude from the monostable precision switch onto a low pass filter. A comparator forms a differential voltage from the d.c. voltage at the output of the low pass filter and the raised input voltage. The controller controls the differential voltage. A comparator located between the output of the amplifier and the remaining controlled system of the voltage/frequency converter forms a controlled variable for the remaining controlled system of the voltage/frequency converter. This controlled variable is formed from the sum of the amplified, raised input voltage at the output of the amplifier and the controlled differential voltage at the output of the controller. Evaluating logic is coupled to the remaining device through a transmission link and a driver stage.

DETAILED DESCRIPTION

Figure 1:
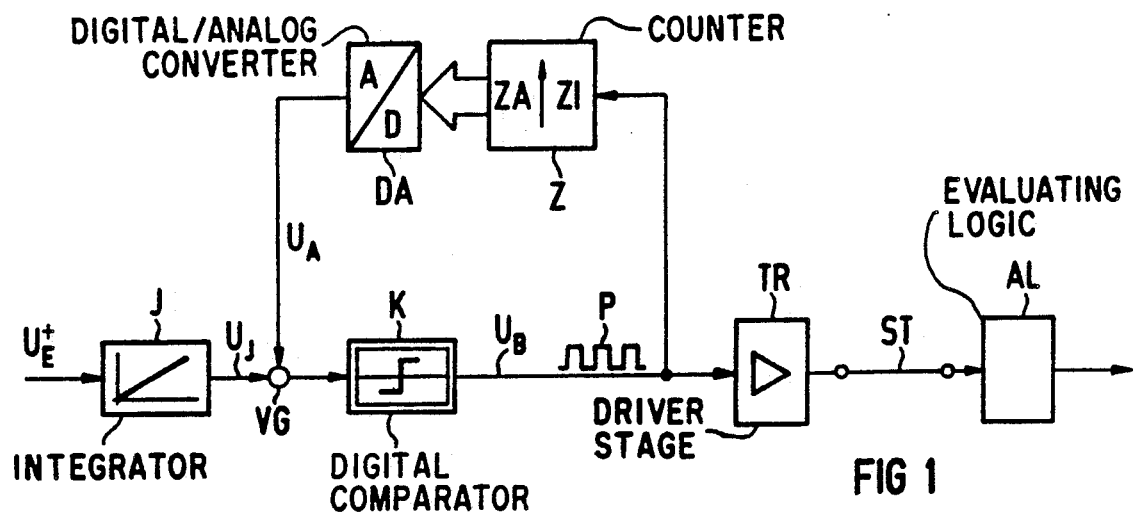
FIG. 1 is a principle circuit diagram of a device for implementing the method of converting voltage to frequency constructed according to the present invention.

Referring to FIG. 1 a principle circuit diagram of a device for implementing the method of the present invention for converting voltage to frequency is shown. The device comprises an integrator J, a comparator VG, a digital comparator K, a driver stage TR, a transmission link ST, and evaluating logic AL. The output of the digital comparator K is coupled to the input ZI of a counter Z. The counter Z is indicated as an upwards counter by an arrow pointing up. The output ZA of the counter Z is coupled to the digital input of a digital/analog converter whose analog output A is coupled to the second input of the comparator VG.

The comparator VG and the digital comparator K are drawn separately in the corresponding Figures for clarity. The comparator VG can also be an integral component of the digital comparator K. In this case, the digital comparator K would then have two inputs.

The direction of the signal flow is indicated in the block diagram by arrows. In this manner, the respective inputs and outputs of each block are indicated.

An input voltage $U_E+$ which is increased into the positive range is input to the integrator J. It is assumed that this input voltage is proportional to the actual current value of a servo motor and should be used for controlling the servo motor. Since only the average value of the input voltage is of interest for the controlling process, this input voltage is first integrated and then transmitted as an integrated voltage $U_J$ to the input of the comparator VG. Simultaneously, a reference voltage $U_A$ is applied to the comparator VG and compared with the integrated voltage $U_J$.

At time $t=0$, the reference voltage $U_A$ and the integrated voltage are equal to zero. Due to the input voltage $U_E$ applied to the integrator J, the integrated voltage $U_J$ increases to a value greater than zero at time t. Because of this, the integrated voltage $U_J$ is greater than the reference voltage $U_A$ on the comparator VG. This causes a binary signal $U_B=$logic "1" to appear at the output of the digital comparator K. This signal arrives at the input ZI of the counter Z and switches this counter Z one counting step higher, whereupon the reference voltage $U_A$ is increased by one constant voltage step at the output A of the digital/analog converter DA. In this manner, as is apparent in FIG. 2, the reference voltage $U_A$ is greater than the integrated voltage $U_J$, and the digital comparator K changes its output signal from logic "1" to logic "0". Thus, as is clear in FIG. 3, a first pulse P is generated at the output of the digital comparator K.

The reference voltage $U_A$ initially remains constant, since the counter Z is not influenced by the binary signal $U_B=$logic "0". The integrated voltage $U_J$, however, continues to rise, as is clear in FIG. 2, until it is again greater than the reference voltage $U_A$ at time $t_2$. This in turn causes a signal $U_B=$logic "1" to be applied to the output of the digital comparator K and the counter Z is again step-enabled by one counting step through its counting pulse input ZI. The reference voltage $U_A$ thus again is raised by one constant voltage step so that at time $t_3$, the digital comparator K again changes its binary output state. Therefore, at the output of the digital comparator K a signal $U_B=$logic "1", when $U_J > U_A$ and a signal $U_B=$logic "0", when $U_J < U_A$ is always formed.

Figure 2:
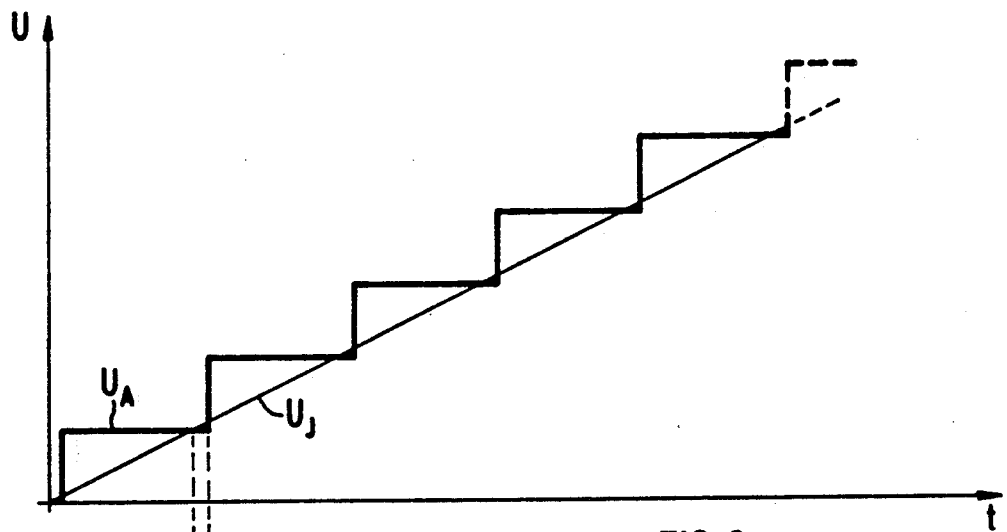
FIG. 2 shows the waveforms of an integrated voltage and a reference voltage of the device of FIG. 1.
Figure 3:
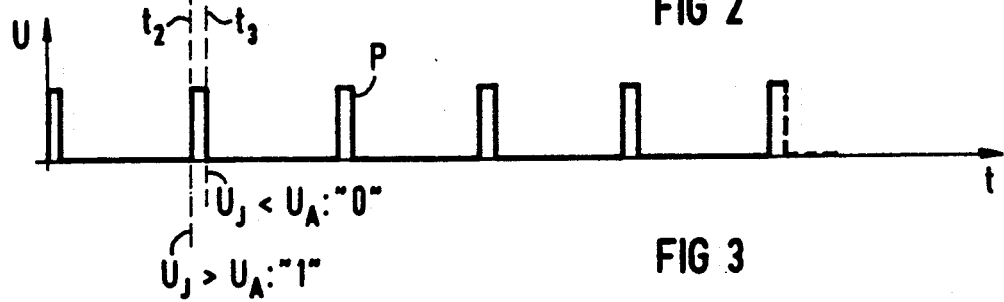
FIG. 3 is the pulse waveform of the device of FIG. 1.

Referring to FIGS. 2 and 3, a reference voltage $U_A$ having a staircase waveform which increases periodically by constant voltage steps and a rectilinearly rising voltage $U_J$ are shown. As is clear in FIG. 3, when the reference voltage $U_A$ is less than the integrated voltage the resulting pulses P have constant pulse intervals. However, the pulses P lie closer together when the integrated voltage $U_J$ has a higher slope. The pulses lie farther apart when the integrated voltage $U_J$ has a lower slope. The sum of the pulses P per unit of time (i.e. their frequency) is directly proportional to the input voltage $U_E+$ for an arbitrary voltage shape of the voltage $U_J$.

Referring to FIG. 1, the pulses P are transmitted over a driver stage T and a transmission link ST to evaluating logic AL. No high demands should be placed on the transmission link ST while the pulses P are being transmitted. The transmission of a high pulse repetition frequency (e.g. 20 MHz) is not problematic since only small demands are placed on the pulse shape and the quality of the present method is not impaired as long as the pulses P are still identifiable by the evaluating logic AL. In case a pulse cannot be identified, no lasting error results since the accuracy of a count is influenced only during one unit of time. In this respect, the method has a high immunity to interference.

The pulse repetition frequency of the voltage/frequency converter can be easily evaluated because it is totaled in a counter (e.g. 16 bit counter) and can be integrated in the evaluating logic AL. This counter can be a component of a digital control device so that the result of the voltage/frequency conversion can be immediately retrieved for controlling purposes. The subsequent processing of the pulse repetition frequency can vary freely through the selection of the sampling times and the various types of averaging. The averaging could take place by the use of a so-called sliding window. In using a sliding window, the number of pulses within one time interval T is counted, where the count is periodically repeated within a shorter time interval than the time interval T.

In the present description of the operation of the voltage/frequency conversion, the ideal assumption was made that the integrator J, the counter Z, and the digital/analog converter DA do not have upper limiting values. In actual components, this is naturally not the case. Therefore, measures must be taken which guarantee the operation of the method even when the integrator J, the counter Z, or the digital/analog converter DA reach their upper or lower limits. These measures are described in reference to FIGS. 4 through 8.

Figure 4:
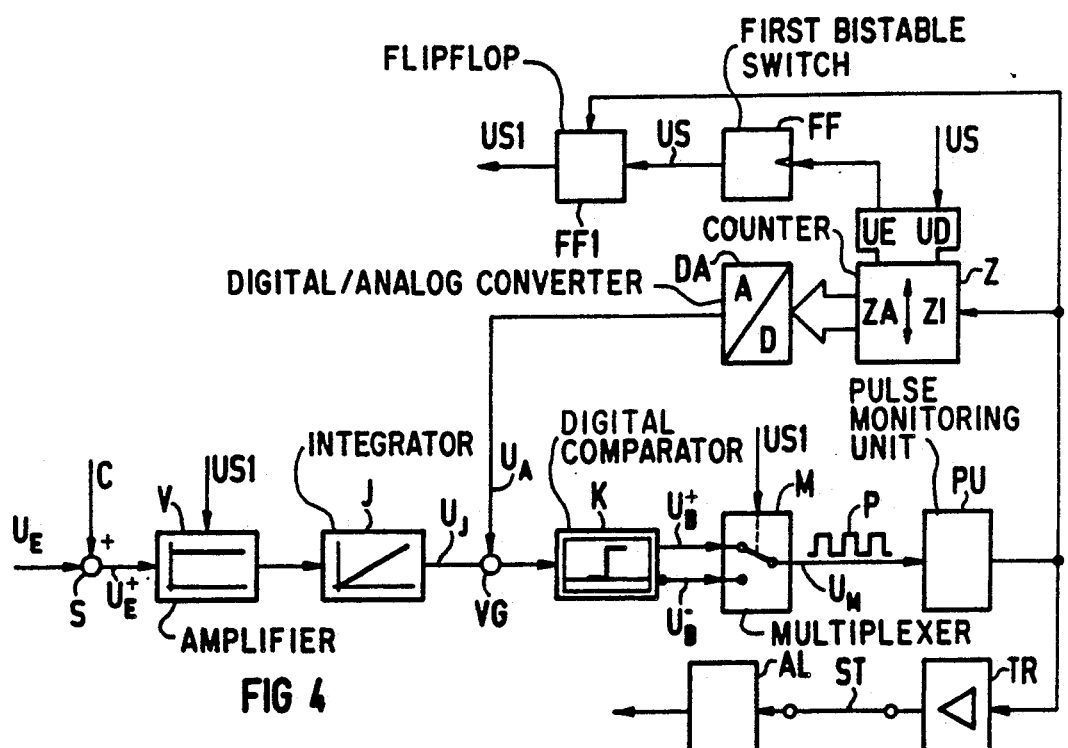
FIG. 4 is a block diagram of a device for converting voltage to frequency constructed according to the present invention.

Referring to FIG. 4, a block diagram of a device for converting voltage to frequency is shown. In addition to the blocks already described in FIG. 1, the block diagram according to FIG. 4 has a summing unit S and an amplifier V before the integrator J. The summing unit S has two inputs. An input voltage $U_E$ acts upon the first input of the summing unit S. A constant C acts upon the second input of the summing unit S. The constant C is calculated so that the input voltage $U_E$ is increased into the positive range $U_E+$. The constant C could also be calculated so that the input voltage $U_E$ is transformed into the negative range. During the transformation of the input voltage $U_E$, it is important that no polarity reversal takes place in the course of its entire temporal progression.

The raised input voltage $U_E+$ acts upon the first input of the amplifier V. A first changeover signal US1 acts upon the second input of the amplifier V. The amplifier V can be switched for positive or negative amplification by these inputs.

Referring to FIG. 4, the digital comparator K is shown having two outputs for binary signals $U_B+$ or $U_B-$. The second output of the digital comparator K, is the complement of the first output and is indicated by a circle. Both of the outputs of the digital comparator K lead to two inputs of a multiplexer M. The multiplexer M is indicated by the symbol for a two-way switch. This two-way switch can also be tripped by the changeover signal US1. A pulse monitoring unit PU, is arranged downstream from the multiplexer M.

The counter Z of FIG. 4 is designed as an up/down counter in contrast to the counter Z of FIG. 1. The counter Z of FIG. 4 is symbolized by a double arrow. In addition to the counting pulse input ZI and the counter output ZA, the counter Z has a counting direction changeover input UD as well as an overshoot signal output UE. A signal can be output over the overshoot signal output UE whenever the counter Z has reached a specifiable counting limit. This overshoot signal UE is transmitted to the input of a bistable switching device FF (flipflop). A changeover signal US appears as a binary signal at the output of the bistable switching device. The changeover signal US is first directly transmitted to the changeover input UD of the counter Z. The changeover signal US is also transmitted to a first bistable switch FF1, where it triggers the time-delayed first changeover signal US1.

Thus, the upper limiting value of the counter Z should be specified so that it is reached before the integrator J reaches its upper physical integration limit. The digital/analog converter should also be designed so that it is suitable for the entire specified counting range of the counter Z.

Referring to FIGS. 5 through 8, the waveforms of the device of FIG. 4 are shown. The integration of the raised input voltage $U_E+$ and the step-enabling of the reference voltage $U_A$ through the counter Z and the digital/analog converter DA takes place according to the method described in reference to FIGS. 1 to 3. The integration of the raised input voltage $U_E+$ and the step-enabling of the reference voltage $U_A$ continues until the counter Z has reached its specified upper limiting value. Upon reaching this upper limiting value, the overshoot signal is transmitted over the overshoot output UE of the counter Z to the bistable switch FF, which in turn changes the binary state at its output. This change of the binary state immediately arrives as a changeover signal US at the changeover input UD of the counter Z.

Figure 5:
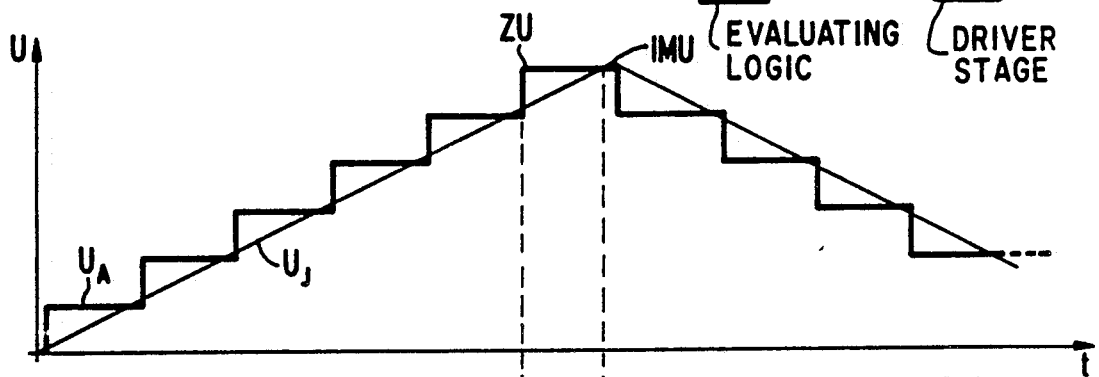
FIG. 5 shows the waveforms of an integrated voltage and a reference voltage of the device of FIG. 4.

As seen in FIG. 5, the counter changeover ZU is brought about at time $t_4$, so that the counter changes its counting direction. Starting with the next counting pulse, the counter will thus count down in constant steps from its upper limiting value. From time $t_4$ to time $t_5$, the integrational direction of the integrator and the integrated voltage $U_J$ still do not change. Namely, the changeover signal US does not directly arrive at the amplifier V and the multiplexer M, but rather is delayed by one counting pulse by the first bistable switch FF1. For this purpose, an additional input of the first bistable switch FF1 is coupled to the output of the multiplexer M or to obtain the output of a pulse monitoring system PU. Because of the delay of the first changeover signal US1, the turnaround of the integrated voltage $U_J$ at the output of the integrator J only takes place when the reference voltage $U_A$ has already advanced in the opposite direction by one constant voltage step. Also, the multiplexer M switches through to its output the still uninverted signal $U_B+$ of the digital comparator K until time $t_5$. Up to a time $t_4$, the operation of the method and device of FIG. 4 is no different from the operation already described in reference to FIGS. 1 through 3.

At time $t_5$, the changeover signal US1 arrives at the amplifier V and at the multiplexer M. The amplification of the amplifier V is changed over by the changeover signal US1. The amplifier now operates with negative amplification. Thus, the integrational direction of the integrator J also reverses, as is shown in FIG. 5. The multiplexer M is changed over by the changeover signal US1 at the same time as the changeover of the amplifier V, so that the signal $U_B-$ arrives at the multiplexer M. The signal $U_B-$ is also applied to the inverted output of the digital comparator K.

It should be noted that the binary signal $U_B+$ can assume both binary states, thus both logic "1" and logic "0". The same is true for the binary signal $U_B-$. The signs "+" and "−" merely indicate the uninverted or inverted outputs of the digital comparator K.

Figure 6:
FIGS. 6 through 8 show the pulse waveforms of the device of FIG. 4.
Figure 7:
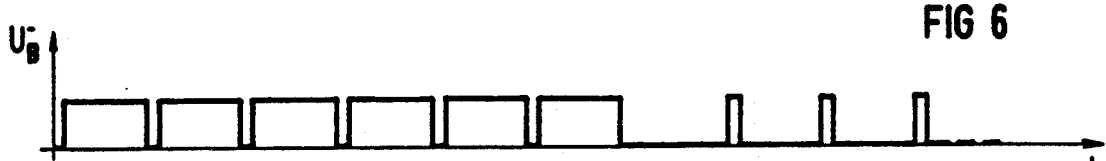
Figure 8:
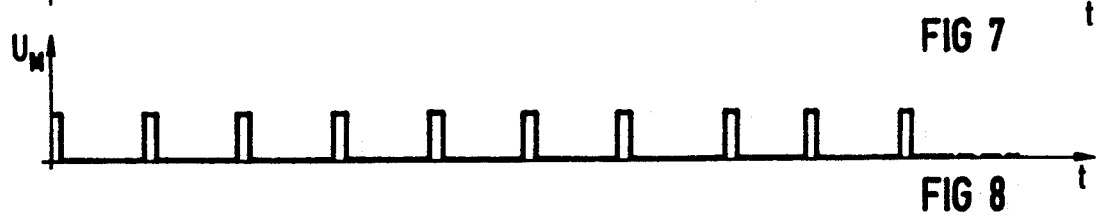

The waveforms of the complementary output signals $U_B+$ and $U_B-$ of the digital comparator K are shown in FIGS. 6 and 7. Up to and including time $t_4$, the signal pattern $U_B+$ of FIG. 6 appears at the output of the multiplexer M. After time $t_4$, the signal pattern $U_B$ appears at the output of the multiplexer M as shown in FIG. 7. The waveform of the signal $U_M$, which is shown in FIG. 8, is generated at the output of the multiplexer M.

When the counter has again reached its lower limit, the bistable switch FF is again controlled through the changeover output UE of the counter Z. The binary output signal of the bistable switch FF changes again. The changeover signal US first reverses the counting direction of the counter Z, which switches the amplifier V again to positive amplification and reconnects the multiplexer M to the output $U_B+$ of the digital comparator K. After the changeover signal has reversed the counting direction of the counter Z, the process starts from the beginning.

Referring to FIG. 4, a pulse monitoring system PU is shown located downstream from the multiplexer M. The pulse monitoring system PU improves the operational reliability of the method and device for converting voltage to frequency. This pulse monitoring system PU switches through at its output the unchanged output signals $U_B+$, $U_B-$ of the multiplexer M during interference-free operation. However, at times the digital comparator K may not switch back at the right time for some reason. This could happen when the integrated voltage $U_J$ increases so rapidly that the reference voltage $U_A$ can no longer catch up to it. If the maximum frequency of the voltage/frequency converter is 20 MHz, then the entire pulse width may not exceed 50 nanoseconds (ns), that is the digital comparator K would have to switch back within 50 ns. If this is not the case, then the absence of a pulse P at the pulse monitoring system PU triggers a sequence of pulses of maximum frequency, where the counter Z and consequently the reference voltage $U_A$ are delay switched with maximum speed in order to catch up with integrated voltage $U_J$. When this occurs, then the requirement for switching back the digital comparator K is achieved again and normal operation is restored.

The pulse monitoring system PU, which includes the capability of generating a pulse sequence having maximum frequency, is able to be integrated into the multiplexer M in a simple manner. With the pulse monitoring system PU it is also possible to select slower and therefore cheaper components having the same maximum frequency (e.g. for the digital/analog converter DA). In using slower and cheaper components, however, the resolution for the higher frequencies would be somewhat lower.

Figure 9:
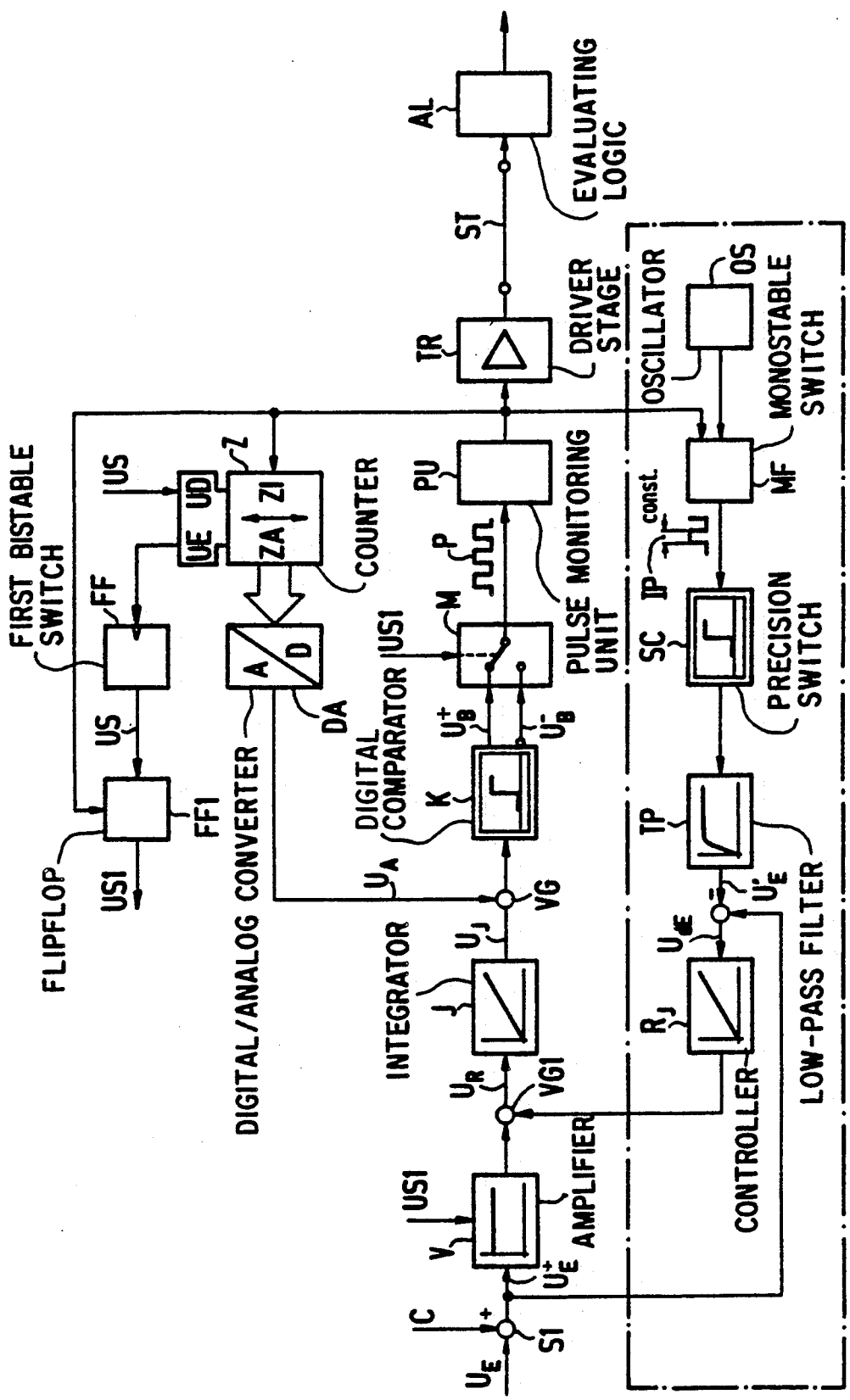
FIG. 9 is a block diagram of a device for converting voltage to frequency, having an error control system, constructed according to the present invention.

The operational reliability of the voltage/frequency converter, which is influenced by the quality of the components, can be further improved by an error control system as is described in reference to FIG. 9.

Referring to FIG. 9 a block diagram of a device for converting voltage to frequency having an error control system is shown. The controlled system for controlling errors is set off by a dashed rectangle. Except for a comparator VG1 located between the amplifier V and the integrator J, the remaining portion of the block diagram corresponds to the block diagram already shown in FIG. 4.

From right to left, the controlled system for controlling errors comprises an oscillator OS, a monostable switch MF (monoflop), a precision switch SC, a low-pass filter TP, a second comparator VG2 and a controller $R_J$. The combination of the oscillator OS and the monoflop MF forms a so-called precision-type monoflop.

The pulses P, which are generated by the voltage/frequency converter, arrive at the input of the monoflop MF. With each of these incoming pulses P, the monoflop MF picks off precisely one cycle of the oscillator OS and generates a precision pulse IP which has a constant pulse width. This precision pulse IP is transmitted to the input of the precision switch SC. The precision switch SC transmits to its output the incoming precision pulses IP with a precisely defined voltage amplitude. The monoflop MF, the oscillator OS, and the precision switch SC thus generate a precision pulse IP with a precisely defined surface area. This precision pulse IP is transmitted to the input of the low-pass filter TP. A d.c. voltage $U_E'$, which is proportional to the pulse repetition frequency, appears at the output of the low-pass filter. In an ideal voltage/frequency conversion, the d.c. voltage $U_E'$ would have to be equal to the raised input voltage $U_E+$. This d.c. voltage $U_E'$ is compared with the raised input voltage $U_E+$ at the comparator VG2 and the resulting differential voltage $U_{dE}$ is applied to the controlled system at the comparator VG1 over a controller $R_J$. In this manner a control voltage $U_R$ is formed at the output of the comparator VG1 from the difference of the differential voltage $U_{dE}$ and the raised and amplified input voltage $U_E+$.

With this error control system, the method and the device operates with sufficient accuracy even when components of lesser quality are used.

What is claimed is:

1. A method of converting voltage to frequency comprising:
    (a) increasing an input voltage, which can have an arbitrary value with respect to time, into the positive range by adding a constant voltage;
    (b) integrating the raised input voltage;
    (c) comparing the integrated voltage with a reference voltage which is variable in constant voltage steps, and generating a binary signal,
        (i) said binary signal corresponding to the binary state logic "1" when the integrated voltage is greater than the reference voltage, and
        (ii) said binary signal corresponding to the binary state logic "0" when the integrated voltage is less than the reference voltage;
    (d) increasing the reference voltage with each signal logic "1", by one constant voltage step;
    (e) repeating steps (a) to (d) until reaching a specified upper limiting value;

(f) upon reaching said limiting value, reversing the integration of the raised input voltage, lowering the reference voltage by one constant voltage step, and inverting the binary signal;

(g) repeating steps (a) to (d) until reaching a specified lower limiting value;

(h) upon reaching said limiting valve, reversing the integration of the raised input voltage, raising the voltage by one constant voltage stop and inverting the binary signal;

(i) repeating steps (a) to (h) cyclically;

(j) counting the pulse generated by the change of the respective binary state logic "0" and logic "1" within a predetermined time interval.

2. The method of claim 1, and further comprising: generating a sequence of auxiliary pulses both (i) when the constant voltage step of the reference voltage does not cause the reference voltage to be greater than the integrated voltage in the case of step (d), and (ii) when the constant voltage step of the reference voltage does not cause the reference voltage to be less than the integrated voltage in the case of step (f).

3. The method of claim 1 and further comprising:
forming a d.c. voltage from the generated pulses;
forming a differential voltage from the d.c. voltage and the raised input voltage;
generating a control voltage from the sum of the differential voltage and the raised input voltage; and
supplying said control voltage as the integration input.

4. The method of claim 2 further comprising:
forming a d.c. voltage from the generated pulses;
forming a differential voltage from the d.c. voltage and the raised input voltage;
generating a control voltage from the sum of the differential voltage and the raised input voltage; and
supplying said control voltage as the integration input.

5. A device for converting voltage to frequency, comprising:

an amplifier with a positive and negative amplification, controllable in response to a changeover signal;

an integrator having as an input the output of the amplifier;

a digital/analog converter;

a digital comparator with at least two inputs, a first input coupled to the output of the integrator and a second input coupled to the analog output of the digital/analog converter, said digital comparator emitting a binary signal logic "1" or logic "0" as a function of the difference of the input signal over a first output, and an inverted binary signal as a function of the difference of the first output over a second output;

a multiplexer having signal inputs coupled to the outputs of the digital comparator and a control input for a changeover signal either applying the uninverted or the inverted binary signal of the digital comparator to its output as a function of the changeover signal;

evaluating logic, coupled to the output of the multiplexer counting incoming pulses within a specific time interval, whereby the sum of the pulses per time interval can be picked off at the output of the evaluating logic for further processing;

a counter which has a changeable counting direction responsive to a changeover input, having a counting pulse input coupled to the output of the multiplexer and a counter output coupled to the digital input of the digital/analog converter, and an overshoot output at which the counter outputs an overshoot signal whenever a respective specifiable upper or lower counting limit is reached; and a bistable switch emitting a changeover signal at each overshoot signal of the counter, said changeover signal bringing about the changeover between the positive and negative amplification of the amplifier, the changeover of the counting direction of the counter by means of its changeover input, as well as the changeover of the multiplexer.

6. The device of claim 5, further comprising:
a pulse monitoring system located between the multiplexer and the evaluating logic, said pulse monitoring system emitting a sequence of auxiliary pulses as a function of the output signals of the multiplexer, the counting pulse input of the counter coupled to the output of the pulse monitoring system.

7. The device of claim 6, further comprising:
an oscillator;
a monostable precision switch coupled to the oscillator generating an output with a constant pulse width at each input pulse;
a low-pass filter;
a switch coupling the incoming precision pulses having a constant amplitude from the monstable precision switch to the low-pass filter;
a comparator having as inputs the d.c. voltage at the output of the low-pass filter and the raised input voltage, and forming therefrom a differential voltage;
a controller having the differential voltage as an input; and
a comparator coupled between the output of the amplifier and the remaining system of the voltage/frequency converter, having the output of said controller as an input, and forming a controlled variable for the remaining system of the voltage/frequency converter from the sum of the amplified, raised input voltage at the output or the amplifier and from the controlled differential voltage at the output of the controller, thereby forming a controlled system for the voltage/frequency converter.

8. The device of claim 5, and further including a transmission link and driver stage coupling the evaluating logic to a using device.

9. The device of claim 6, and further including a transmission link and driver stage coupling the evaluating logic to a using device.

10. The device of claim 7, and further including a transmission link and driver stage coupling the evaluating logic to a using device.

* * * * *